United States Patent
Watanabe et al.

(10) Patent No.: US 7,285,792 B2
(45) Date of Patent: Oct. 23, 2007

(54) SCRATCH REPAIRING PROCESSING METHOD AND SCANNING PROBE MICROSCOPE (SPM) USED THEREFOR

(75) Inventors: Naoya Watanabe, Chiba (JP); Osamu Takaoka, Chiba (JP)

(73) Assignee: SII NanoTechnology Inc. (JP)

( * ) Notice: Subject to any disclaimer, the term of this patent is extended or adjusted under 35 U.S.C. 154(b) by 260 days.

(21) Appl. No.: 11/086,812

(22) Filed: Mar. 21, 2005

(65) Prior Publication Data

US 2005/0205805 A1  Sep. 22, 2005

(30) Foreign Application Priority Data

Mar. 22, 2004  (JP) .............................. 2004-082214

(51) Int. Cl.
 *G01B 5/28* (2006.01)
(52) U.S. Cl. ................. 250/492.2; 250/492.2; 250/309; 430/5; 356/237.5
(58) Field of Classification Search ............... None
See application file for complete search history.

(56) References Cited

U.S. PATENT DOCUMENTS

| | | | |
|---|---|---|---|
| 6,583,411 B1 * | 6/2003 | Altmann et al. | 250/306 |
| 6,821,682 B1 * | 11/2004 | Stearns et al. | 430/5 |
| 2005/0061249 A1 * | 3/2005 | Miyahara et al. | 118/722 |

* cited by examiner

*Primary Examiner*—Jack I. Berman
*Assistant Examiner*—Zia R. Hashmi
(74) *Attorney, Agent, or Firm*—Adams & Wilks

(57) ABSTRACT

A sample to be processed is disposed within a processing cell which contains a liquid. Scratch processing using a scanning probe microscope is performed within the liquid so that chips or shavings removed from the sample scatter within the liquid rather than collecting on the surface of the sample. The processing cell has a supply port and a discharge port so that new liquid can be supplied within the cell through the supply port after the termination of the scratch processing to clean the cell. In this manner, chips or shavings generated by scratch processing a defect portion of the sample can be removed completely without being collected at the surface of a sample despite the surface tension of adsorbed water existing on the sample surface and/or electrostatic charges caused by friction.

18 Claims, 4 Drawing Sheets

PROCESSING WITHIN ATMOSPHERE

SCRATCH REPAIRING PROCESSING METHOD AND SCANNING PROBE MICROSCOPE (SPM) USED THEREFOR

BACKGROUND OF THE INVENTION

1. Field of the Invention

The present invention relates to a technique of removing shavings which are generated at the time of a so-called scratch processing for removing unnecessary portions of a sample by scraping the sample using a probe of a scanning probe microscope, and more particularly relates to a remaining shavings removing technique which is effective in the black defect repair, etc. of a photo mask.

2. Description of Related Art

As the defects of a photo mask used for fabricating semiconductor devices, there are a defect (a so-called black defect) which distorts a translucent pattern due to an excessive attachment, a defect which forms an excessive phase shifter pattern during the fabrication of a phase shifter pattern, and a defect (a so-called white defect) which distorts a translucent pattern due to a defect in a light shielding film pattern. These defects are generally named as the mask defects. The photo mask is carefully subjected to the repairing processing of the defects thereof and then used for the semiconductor device fabricating process. This is because, since many semiconductor devices are fabricated based on the mask, the defects of the photo mask itself are reflected on all the semiconductor devices to be fabricated. There are some mask repairing methods for removing residual defects such as the black defect or the excessive phase shifter pattern. The first method is arranged in a manner that a laser beam is focused and irradiated on defects to evaporate and remove the defects. This method causes a problem that, as a result of the heat of the laser irradiation, distortion appears at the processed edge portion of the mask and so the configuration of the mask after the processing is not so good. Further, there arises such a problem that since the narrowing of the laser beam is limited, the micro-fabrication of 500 nm or less is difficult. The second method is arranged in a manner that a converged ion beam is irradiated on a photo mask to remove and repair the defects thereof through the spattering. According to this method, it is known that gallium as an ion source is implanted into a quartz as a mask substrate in the ion beam irradiation area to generate gallium stains and so light transmittance is degraded, and that ions are also irradiated on the quartz substrate at the peripheral portions of the residual defects and so the transmissivity of the substrate is degraded due to the excessive spattering. Thus, the mask itself is damaged due to the repairing process. These matters increasingly have become large problems in accordance with the recent tendency of the micro-fabrication of the semiconductor pattern.

Recently, as a method of such a kind of the mask repairing, there has been developed and notified a technique in which excessive portions such as black defects are scraped away by the probe of a probe microscope such as an atomic force microscope (AFM). The invention disclosed in a patent document 1 intends to provide a defect repairing method of the photo mask in which there is no damage to a quartz substrate and portions other than defects after the repair of the residual defects formed on a mask, then residual defects of 500 nm or less can be removed effectively, and the end point of the repair can be detected easily and a scanning probe microscope used therefor. To this end, as shown in FIG. 7A, a mask is set to the scanning probe microscope, and the stage of the microscope is moved so that the probe D is positioned just above the residual defect A. Next, as shown in FIG. 7B, the tip end of the probe D is approached to a position where it contacts the residual defect A. Then, as shown in FIG. 7C, while scanning the probe in the X and Y directions only in the region of the residual defect A, the probe D is pushed down to apply a load to the defect thereby to scratch the defect to scrape the defect away. Next, as shown in FIG. 7D, when the tip end of the probe D reaches the quartz substrate B, the push-down operation and the scanning operation in the X and Y directions of the probe D are stopped. Next, as shown in FIG. 7E, the probe D is largely separated from the mask pattern. Finally, as shown in FIG. 7F, cleaning air is blown toward the mask from a clean air gun E to completely remove the shavings form the mask, whereby the defect repairing method of the photo mask is completed.

Although this method scrapes the defect portions off by using the probe, since this probe is one for the probe microscope, there does not arise the defects caused in the case of using a laser beam or an ion beam. Further, since the defect area is suitably scanned in the X and Y directions during the defect repairing operation for scraping the defect portions off, the repairing state can be observed. Furthermore, since the scraping operation can be performed while observing the processing state, there does not cause such a problem that there remains a portion to be scraped or there is a portion too scraped. However, according to this method, as shown in FIG. 6, shavings remain around the scraped portion and so also remain on the surface of the sample having been processed (hereinafter, the shavings are called as remaining shavings). According to the aforesaid method, the cleaning air is blown toward the mask from the clean air gun to remove the remaining shavings from the mask. However, in such an on-machine remaining shavings removing processing using the air gun, there arises a case that particles of nano-order sizes are scattered within the apparatus to pollute the mask as shown in FIG. 5. In particular, the residual shavings collect at the surface of the mask, due to the surface tension of adsorbed water existing on the mask surface and/or electrostatic charges caused by friction, can not be removed easily.

[Patent Document 1] JP-A-2003-43669 ("Method of Correcting Defect of Photomask and Scanning probe microscope", paragraphs [0016], [0016], FIG. 1)

SUMMARY OF THE INVENTION

An object of the invention is to provide a technique in which chips generated by a defect portion scraping processing using a scanning probe microscope can be removed completely without being collected at the surface of a sample despite of the surface tension of adsorbed water existing on the sample surface and/or electrostatic charges caused by friction.

The invention is arranged in a manner that a subject or sample to be processed is disposed within a cell in which liquid is contained or reserved. The scratch processing using a scanning probe apparatus such as a scanning probe microscope is performed within the liquid so that there does not arise a case that chips or shavings scatter within the liquid to remain on the surface of the sample.

The scanning probe microscope (SPM) for a scratch repairing processing according to the invention is arranged to include:

moving means for scan driving a probe under a control of control means;

means for detecting a deviation of the probe; and a processing cell for reserving liquid which is placed on a sample stage, wherein the probe moving means has a function of scan driving the probe within the liquid within the processing cell.

Further, the processing cell is provided with a supply port and a discharge port for the liquid, as required, so that new liquid is supplied within the cell through the supply port after the termination of the scratch processing to clean within the cell.

The removing method of remaining shavings generated by a defect portion scraping processing by using a scanning probe microscope according to the invention is arranged to include a step of:

scratch-processing a sample within the liquid using a scanning probe microscope in a state that a subject to be processed is placed within a cell in which liquid is reserved, so that chips or shavings scatter within the liquid, rather than remaining on a surface of the sample. Collection due to electrostatic and/or adsorbed water is prevented. The surface of the processed subject pulled up from the cell is clean, washed with the liquid. It is not necessary to perform cleaning process after processing with an air gun.

Since the processing cell is provided with a supply port and a discharge port for the liquid so that new liquid is supplied within the cell through the supply port after termination of the scratch processing to clean within the cell, the cleaning effect can be further enhanced and so the shavings or chips can be completely removed.

DESCRIPTION OF THE PREFFERED EMBODIMENT

Figure 4:
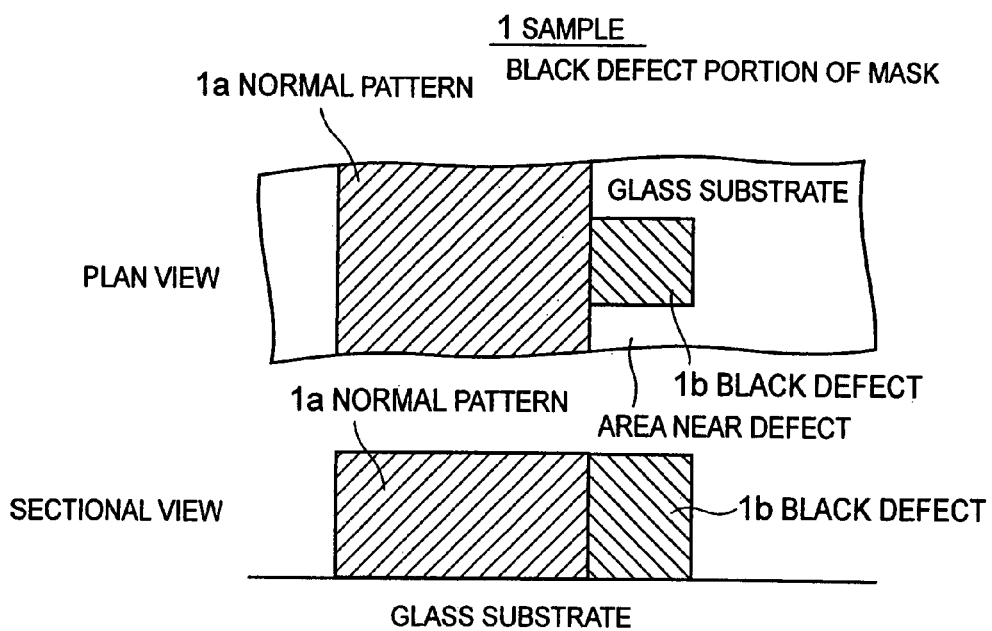
FIG. 4 is a diagram showing an example of a black defect portion of a mask to be processed in the invention.
Figure 5:
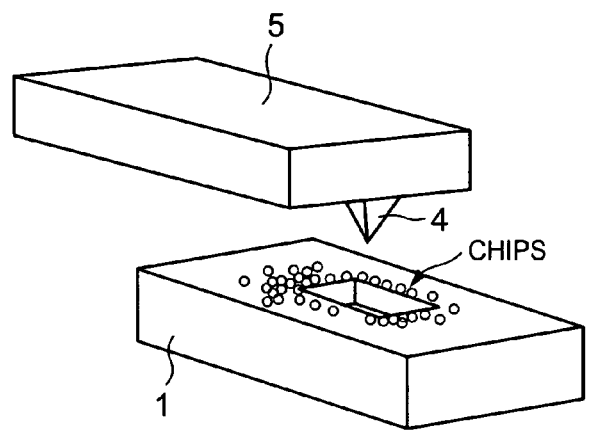
FIG. 5 is a diagram showing a state of chips when a scratch processing is executed with the conventional scanning probe microscope.
Figure 6:
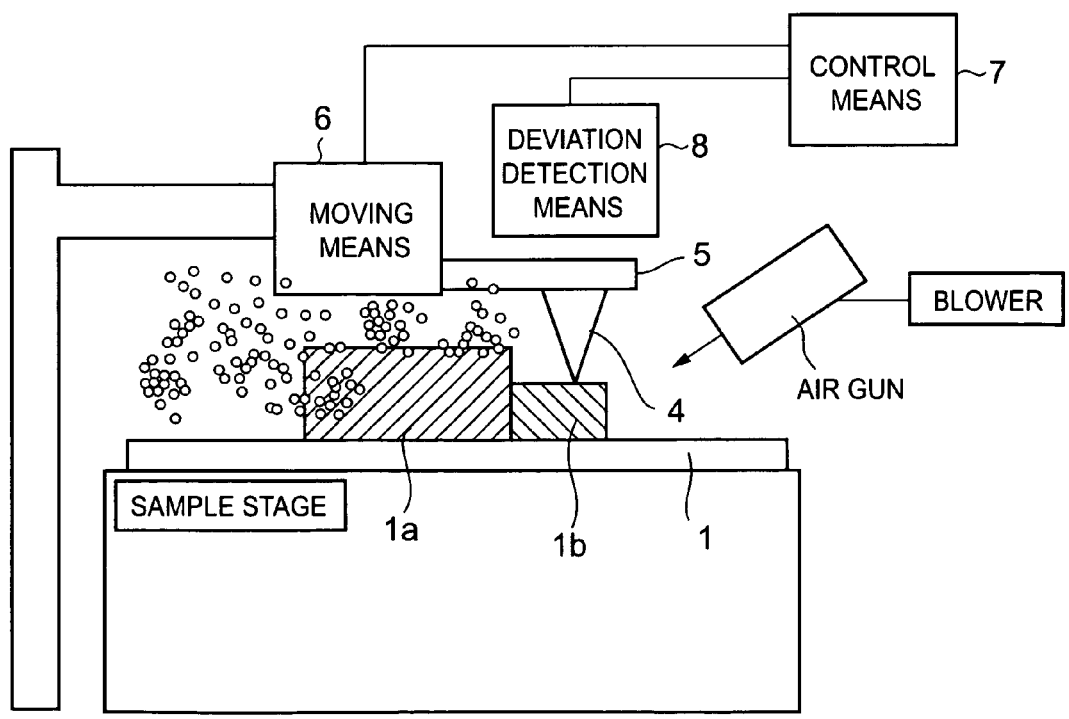
FIG. 6 is a diagram for explaining a state where chips are blown by an air gun.
Figure 7A:
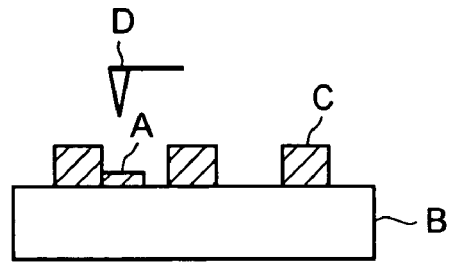
FIG. 7A through FIG. 7F are diagrams for explaining the embodiment of the scratch processing using the conventional scanning probe microscope.
Figure 7B:
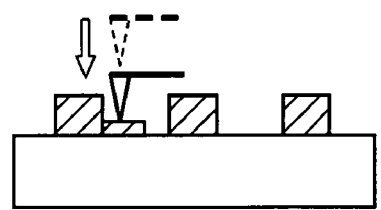
Figure 7C:
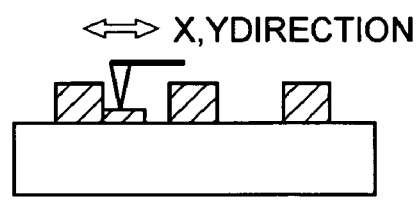
Figure 7D:
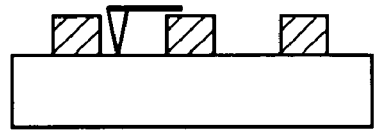
Figure 7E:
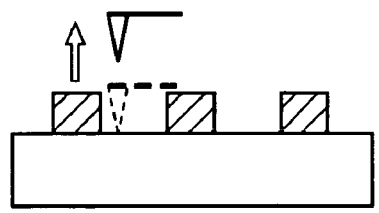
Figure 7F:
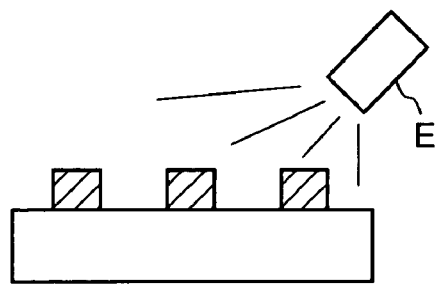

The invention relates to the repair processing of a mask in which an unwanted portion of the mask, such as a black defect portion, is attached to the boundary portion of a normal pattern as shown in FIG. 4, for example, and also relates to the defect repairing technique according to the scratch processing using the probe of a scanning probe microscope. The invention provides a technique in which remaining shavings or chips generated by a defect portion scraping processing can be removed completely without being collected at the surface of a sample despite the surface tension of adsorbed water existing on the sample surface and/or electrostatic charges caused by friction. To this end, the invention is realized in a manner that a subject to be processed is disposed within a cell in which liquid is reserved and the scratch processing using a scanning probe microscope is performed within the liquid. Since the subject to be processed is disposed within the liquid, there does not arise such a case that adsorbed water adheres to the surface of the subject and electrostatic caused by friction at the time of the scratch processing are charged on the surface of the subject.

Figure 1:
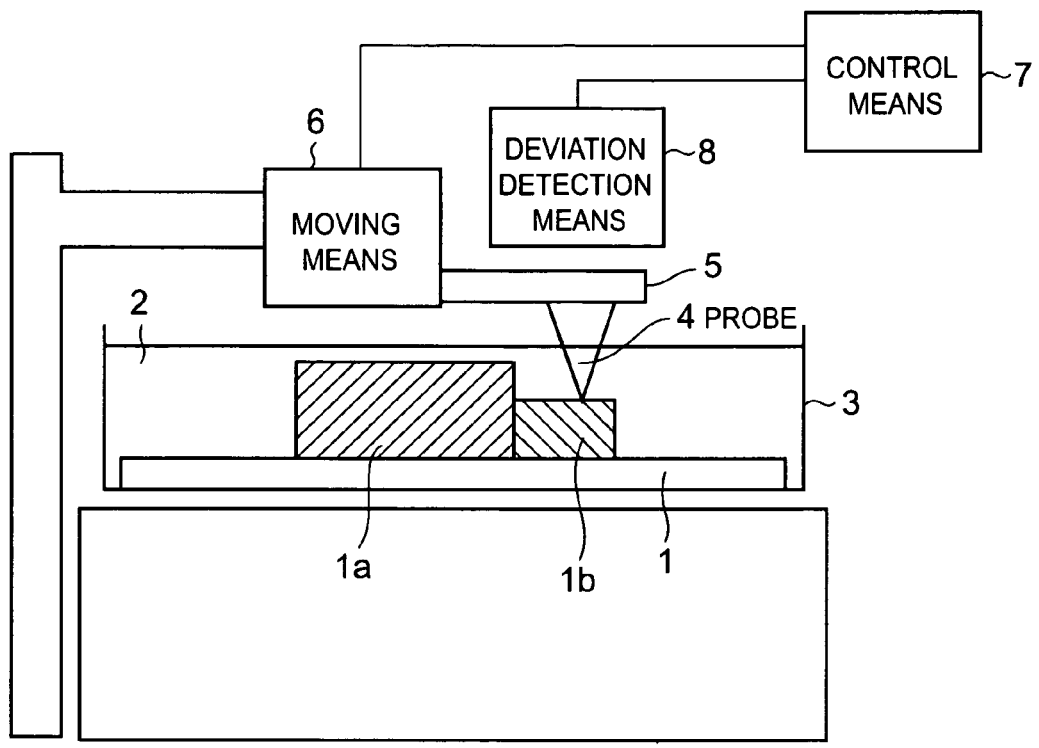
FIG. 1 is a diagram showing the basic configuration of a scanning probe microscope for scratch repair processing according to the invention.

FIG. 1 shows the basic configuration of a scratch processing apparatus for repairing a mask according to the invention. The main feature of the apparatus resides in that a sample 1 is placed within a container in the form of a processing cell 3 in which liquid 2 is contained so that the scratch processing is performed within the processing cell. The sample 1 having a normal pattern 1a and a black defect portion (unwanted portion) 1b adjacent to the normal pattern is disposed within the cell 3. The defect portion is scraped off by the probe 4 of a probe microscope. The probe 4 is attached to a moving means 6 via a cantilever 5. The moving means 6 is controlled under the control of a control means 7. The apparatus is further provided with a probe deviation detection means 8 for detecting the three-dimensional position of the probe 4.

Figure 2:
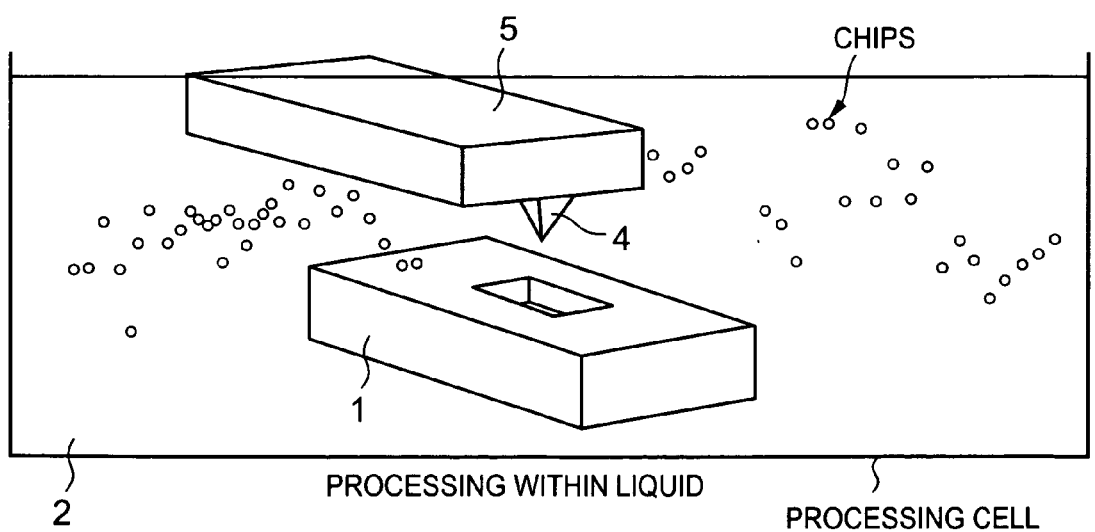
FIG. 2 is a diagram showing a state where chips scatter within liquid of. a processing cell according to the invention.

As the defect repairing process, at first, 1) the sample 1 is placed within the processing cell 3. 2) The surface of the sample is scanned in the X and Y directions in accordance with the function of the probe microscope to detect the presence of defect portions and the positions and the shapes of the defect portions. This operation is performed in a manner that the moving means 6 is driven under the control of the control means 7 thereby to scan a designated region with the probe 4 in a raster scanning manner. 3) When a SPM (scanning probe microscope) image is obtained, the image is compared with a standard pattern etc. to detect the defect portions, and information relating to the positions of the defect portions and the shapes thereof is stored in the storage unit of the control means 7 of a computer etc. 4) The moving means 6 is driven in accordance with the positional information of the defects thus detected thereby to move the probe 4 to the position of a defect portion. 5) The pressing force of the probe 4 is made larger to perform the scratch processing based on the shape of the defect portion thus obtained. 6) During the scratch processing, the scratch processing is interrupted and an image of the processed region is obtained according to the function of the SPM to ascertain the processing state. 7) When it is confirmed by repeatedly performing these processings 5) and 6) that the black defect is scraped off, the processing is terminated. Since the processing 5) is performed within the liquid of the cell 3, chips or scrapings scatter and disperse within the liquid, not remaining on the surface of the sample, as shown in FIG. 2. Except for a particularly required case, without performing the cleaning operation of the sample, the chips resulted from the scratch processing do not remain at all on the surface of the sample when the sample is pulled up and withdrawn from the liquid.

Figure 3:
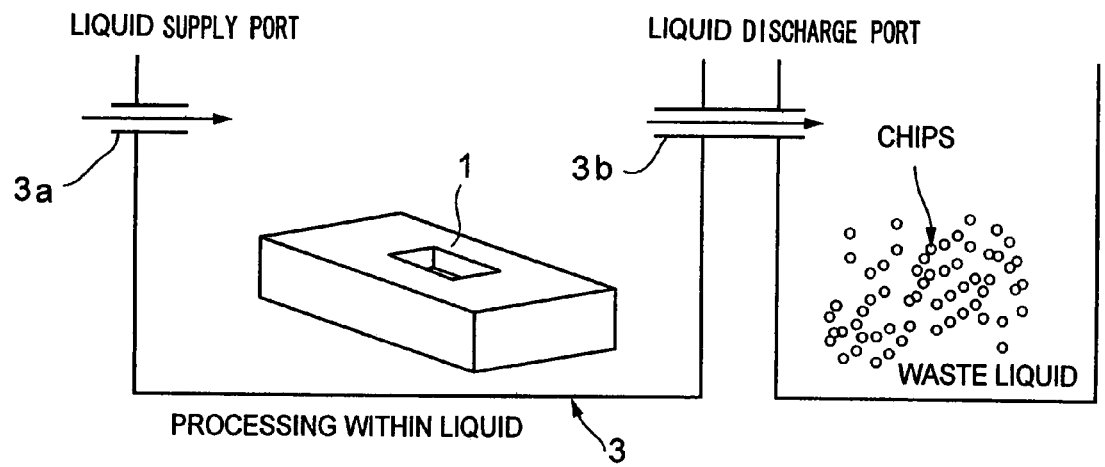
FIG. 3 is a diagram for explaining a method in which the processing cell is provided with a liquid supply port and a liquid discharge port thereby to completely eliminate chips from the surface of a sample.

Next, in the case of a sample which is particularly required to remain no residual shavings or chips thereon, the processing cell 3 is provided with a supply port 3a and a discharge port 3b for the liquid as shown in FIG. 3. In this case, after the completion of the scratch processing, new liquid is supplied from the supply port 3a within the processing cell and the liquid having been used in the scratch processing is discharged from the discharge port 3b as waste liquid. In this manner, when the apparatus is configured in a manner that the processing cell 3 is provided with the supply port 3a and the discharge port 3b for the liquid so that the sample 1 can be cleaned, the cleaning effect can be further enhanced and so the shavings or the chips can be completely removed.

[Description of the Reference Numerals and Signs]

| | |
|---|---|
| 1 | sample |
| 1a | normal pattern |
| 1b | defect portion |
| 2 | liquid |
| 3 | processing cell |
| 4 | probe |
| 5 | cantilever |
| 6 | moving means |
| 7 | control means |
| 8 | deviation detection means |

What is claimed is:

1. A scratch repairing processing method for scratch-processing an excessive defect of a sample by using a probe of a scanning probe microscope, the method comprising the steps of:
   providing a sample having an excessive defect; and
   scratch-processing the sample using the probe of the scanning probe microscope to remove the excessive defect while the sample is placed within a liquid so that chips or shavings removed from the sample scatter within the liquid rather than remaining on a surface of the sample.

2. A scanning probe microscope for a scratch repairing processing: comprising:
   a sample stage;
   a processing cell placed on the sample stage and containing a liquid in which is placed, during use of the scanning probe microscope, a sample having an excessive defect;
   moving means for scan driving a probe within the liquid contained in the processing cell under control of control means to remove the excessive defect; and
   means for detecting a deviation of the probe.

3. A scanning probe microscope for a scratch repairing processing according to claim 2; wherein the processing cell has a supply port and a discharge port for the liquid so that new liquid can be supplied within the cell through the supply port to clean within the cell.

4. A scratch repairing processing method according to claim 1; further including the steps of providing a processing cell that contains the liquid; carrying out the scratch-processing step while the sample is placed within the liquid in the processing cell; and replacing the liquid in the processing cell to remove the chips or shavings scattered within the liquid.

5. A scratch repairing processing method according to claim 4; further including the step of withdrawing the scratch-processed sample from the liquid.

6. A scratch repairing processing method according to claim 1; further including the step of withdrawing the scratch-processed sample from the liquid.

7. A scratch repairing processing method according to claim 6; wherein the sample is a photo mask and the excessive defect is a black defect.

8. A scratch repairing processing method according to claim 1; wherein the sample is a photo mask and the excessive defect is a black defect.

9. A method of removing an unwanted portion of a sample, comprising the steps:
   providing a sample having an unwanted portion that is to be removed;
   immersing the sample in a liquid; and
   using a probe of a scanning probe apparatus to remove the unwanted portion of the sample while the sample is immersed in the liquid.

10. A method according to claim 9, further including the step of withdrawing the sample from the liquid after removal of the unwanted portion of the sample.

11. A method according to claim 10; wherein the using step comprises scanning the probe while pressing the probe against the unwanted portion of the sample so that the probe scrapes off the unwanted portion of the sample and the scraped-off scrapings disperse in the liquid.

12. A method according to claim 11; wherein the immersing step comprises immersing the sample in a container containing the liquid.

13. A method according to claim 11; wherein the sample is a photo mask and the unwanted portion is a black defect.

14. A method according to claim 9; wherein the using step comprises scanning the probe while pressing the probe against the unwanted portion of the sample so that the probe scrapes off the unwanted portion of the sample and the scraped-off scrapings disperse in the liquid.

15. A method according to claim 9; wherein the sample is a photo mask and the unwanted portion is a black defect.

16. A method according to claim 9; wherein the immersing step comprises immersing the sample in a container that is disposed on a sample stage of the scanning probe apparatus and that contains the liquid.

17. A method according to claim 16; wherein the using step comprises scanning the probe while pressing the probe against the unwanted portion of the sample so that the probe scrapes off the unwanted portion of the sample and the scraped-off scrapings disperse in the liquid.

18. A method according to claim 17; further including the step of withdrawing the sample from the liquid after removal of the unwanted portion of the sample.

* * * * *